US012562345B2

(12) United States Patent
Kobayashi et al.

(10) Patent No.: US 12,562,345 B2
(45) Date of Patent: Feb. 24, 2026

(54) MONITORING METHOD AND PLASMA PROCESSING APPARATUS

(71) Applicant: Tokyo Electron Limited, Tokyo (JP)

(72) Inventors: Takeshi Kobayashi, Iwate (JP); Jun Sato, Iwate (JP); Takashi Chiba, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 148 days.

(21) Appl. No.: 18/199,623

(22) Filed: May 19, 2023

(65) Prior Publication Data

US 2024/0006163 A1    Jan. 4, 2024

(30) Foreign Application Priority Data

May 25, 2022    (JP) .................................. 2022-085132

(51) Int. Cl.
H01J 37/32            (2006.01)
(52) U.S. Cl.
CPC ..... H01J 37/32458 (2013.01); H01J 37/3211 (2013.01); H01J 37/32715 (2013.01); H01J 37/32917 (2013.01)
(58) Field of Classification Search
CPC ............. H01J 37/32458; H01J 37/3211; H01J 37/32715; H01J 37/32917; C23C 16/44; C23C 16/505; H01L 21/31; H01L 21/316; H01L 21/318; H05H 1/46
See application file for complete search history.

(56) References Cited

U.S. PATENT DOCUMENTS

2018/0315581 A1* 11/2018 Hayami .............. H01J 37/3299

FOREIGN PATENT DOCUMENTS

JP        2021-180215 A    11/2021

* cited by examiner

*Primary Examiner* — Henry Luong
(74) *Attorney, Agent, or Firm* — Venjuris, P.C.

(57) ABSTRACT

A monitoring method includes steps of (a) placing a substrate on a mounting stage of a processing chamber of a plasma processing apparatus; (b) supplying a pulsed wave of RF power with a predetermined duty ratio from an RF power supply connected to an antenna; and (c) monitoring a plasma state based on a converted value of a Vpp voltage of an output terminal of a matching unit arranged between the antenna and the RF power supply. The converted value of the Vpp voltage is obtained by converting the Vpp voltage of the output terminal voltage based on the duty ratio, the RF power, and correlation information indicating a correlation between the Vpp voltage and the RF power.

7 Claims, 9 Drawing Sheets

MONITORING METHOD AND PLASMA PROCESSING APPARATUS

CROSS-REFERENCE TO RELATED APPLICATIONS

The present application is based on and claims priority from Japanese Patent Application No. 2022-085132, filed on May 25, 2022, with the Japan Patent Office, the disclosure of which is incorporated herein in its entirety by reference.

TECHNICAL FIELD

The present disclosure relates to a monitoring method and a plasma processing apparatus.

BACKGROUND

In one example, Japanese Patent Laid-Open Publication No. 2021-180215 discloses a plasma processing apparatus including a vacuum chamber in which a rotary table and an antenna are provided. The rotary table rotates while carrying a plurality of substrates on the upper surface thereof. The antenna is positioned to face the upper surface of the rotary table. In the plasma processing apparatus, a plasma processing gas is supplied into the vacuum chamber and a pulsed wave of radio frequency (RF) power is supplied into the antenna while the rotary table rotates.

SUMMARY

According to one aspect of the present disclosure, a monitoring method executed by a plasma processing apparatus is provided. The plasma processing apparatus includes a processing chamber; a stage disposed in the processing chamber and configured to place a substrate thereon; an antenna provided on an upper part of the processing chamber; an RF power supply connected to the antenna and configured to supply RF power; a matching unit arranged between the antenna and the RF power supply; and a measuring unit configured to measure a voltage at an output terminal of the matching unit. The monitoring method includes steps of (a) placing the substrate on the stage; (b) supplying a pulsed wave of the RF power with a predetermined duty ratio from the RF power supply; and (c) monitoring a plasma state based on a converted value of a Vpp voltage obtained by converting the Vpp voltage of the output terminal voltage based on the duty ratio, the RF power, and correlation information indicating a correlation between the Vpp voltage and the RF power.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
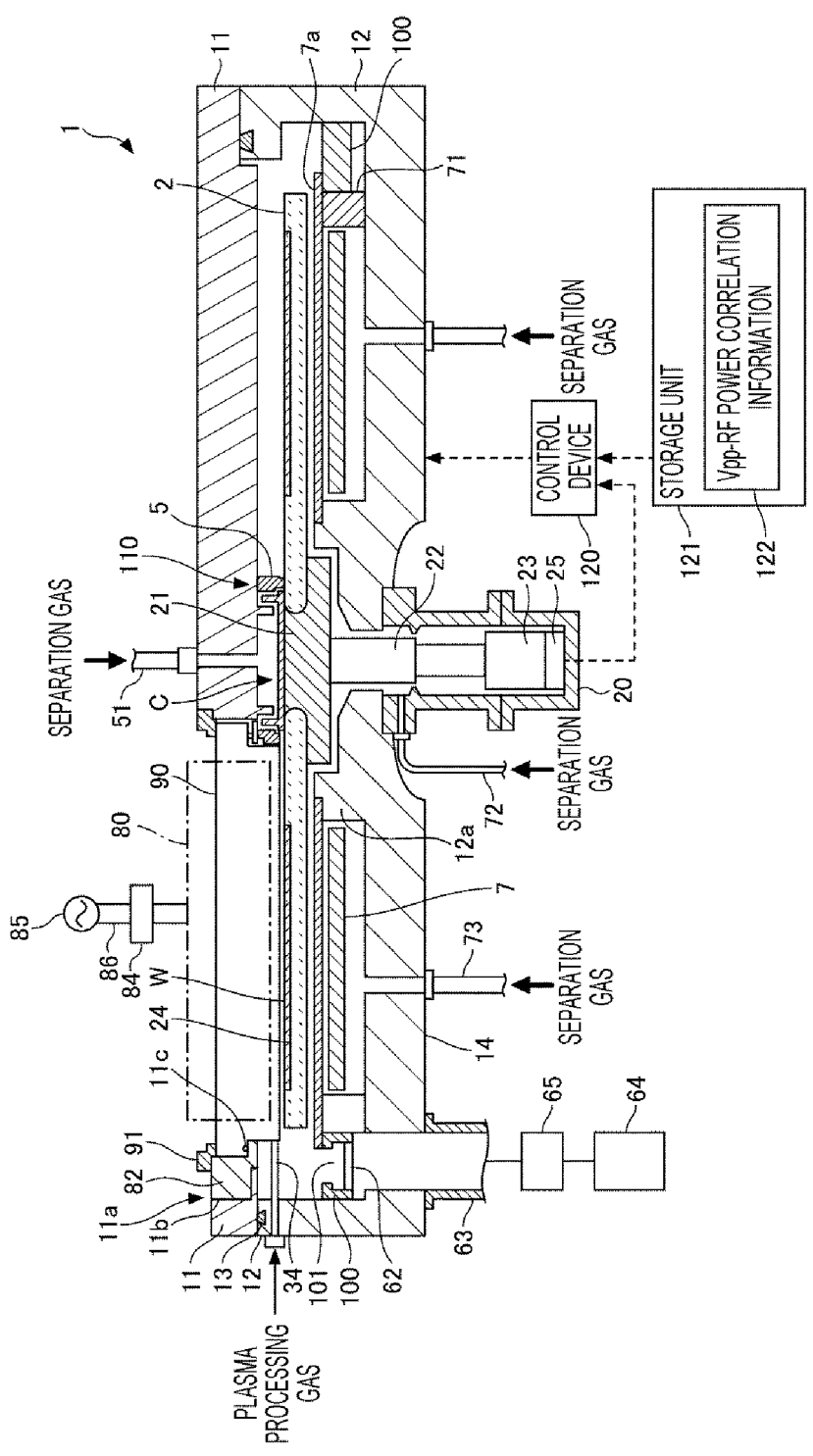
FIG. 1 is a cross-sectional view illustrating an exemplary configuration of a plasma processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Embodiments disclosed as the best mode contemplated for carrying out the present disclosure are described below with reference to the drawings. Like reference numerals denote identical or corresponding components throughout the drawings, and redundant descriptions may be omitted.

The terms used herein indicating directions of parallel, perpendicular, orthogonal, horizontal, vertical, height, widthwise, or the like are allowed to deviate within a range that does not impair the effects of the embodiment. The shape of the corners is not limited to right angles and can be arcuately rounded. The terms parallel, perpendicular, orthogonal, horizontal, vertical, circular, and coincident can encompass substantially parallel, substantially perpendicular, substantially orthogonal, substantially horizontal, substantially vertical, substantially circular, and substantially coincident, respectively.

[Plasma Processing Apparatus]

Figure 2:
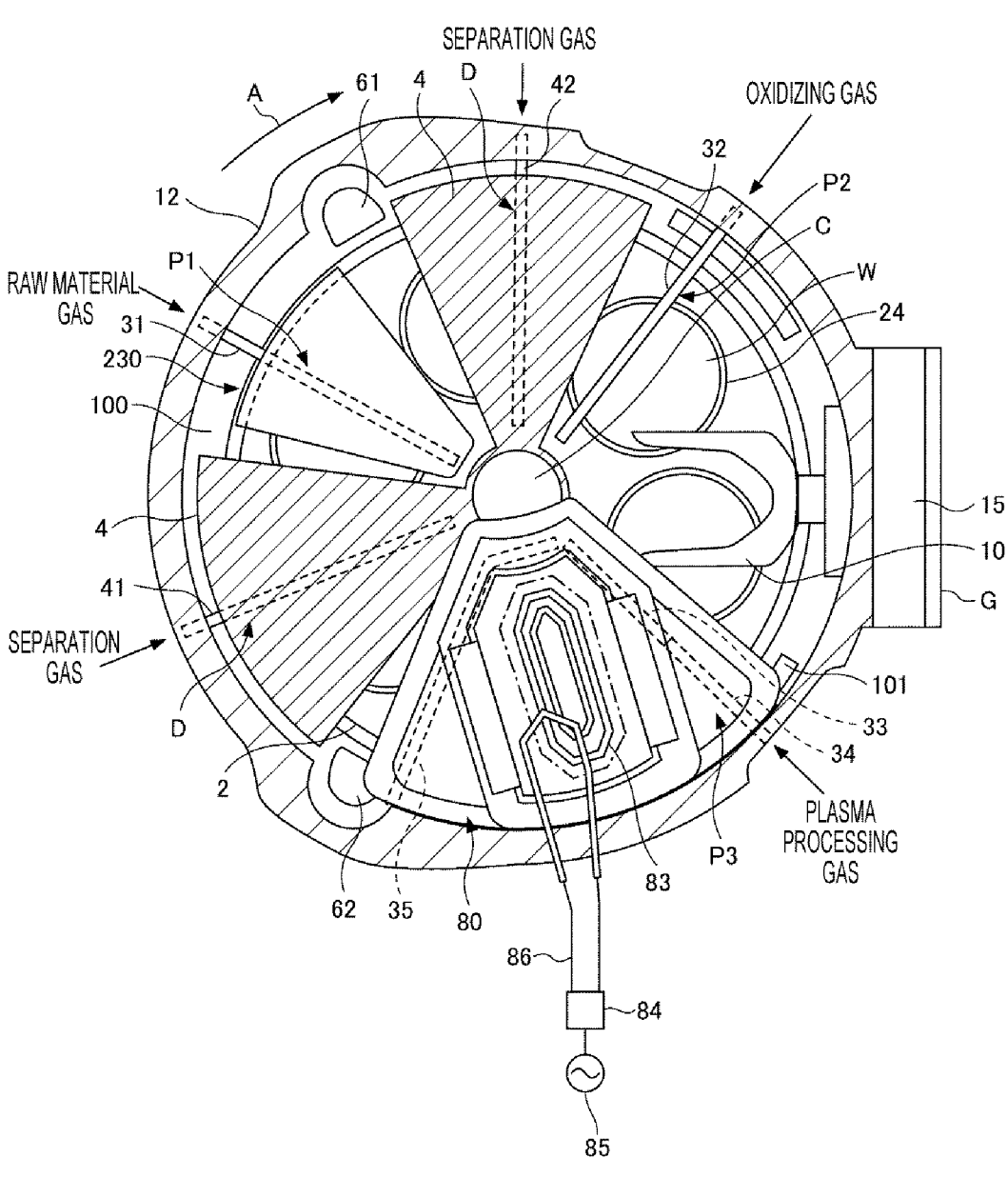
FIG. 2 is a plan view of the plasma processing apparatus illustrated in FIG. 1.
Figure 3:
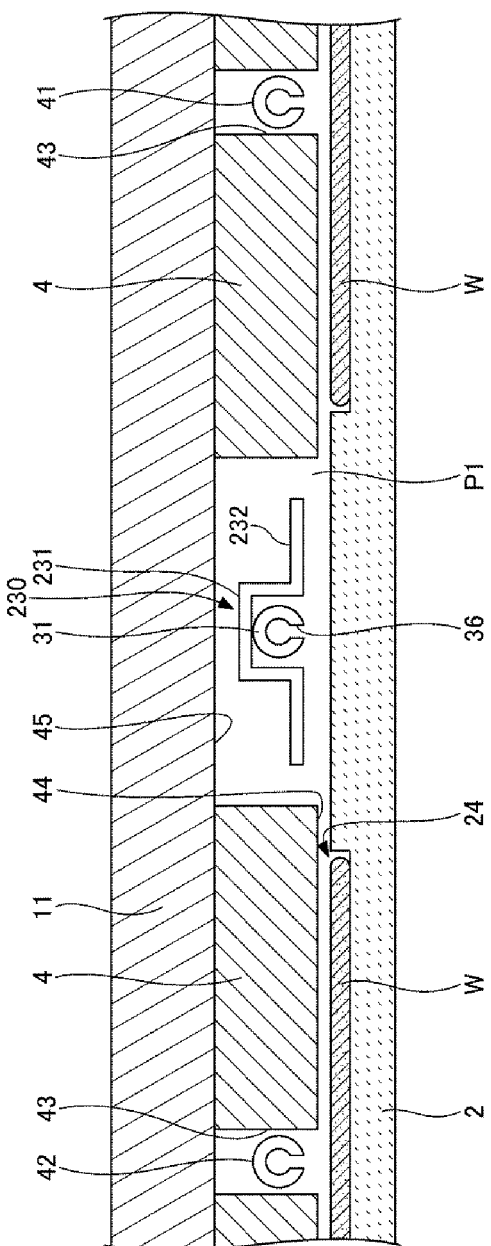
FIG. 3 is a cross-sectional view taken along a concentric circle of a rotary table of the plasma processing apparatus illustrated in FIG. 1.
Figure 4:
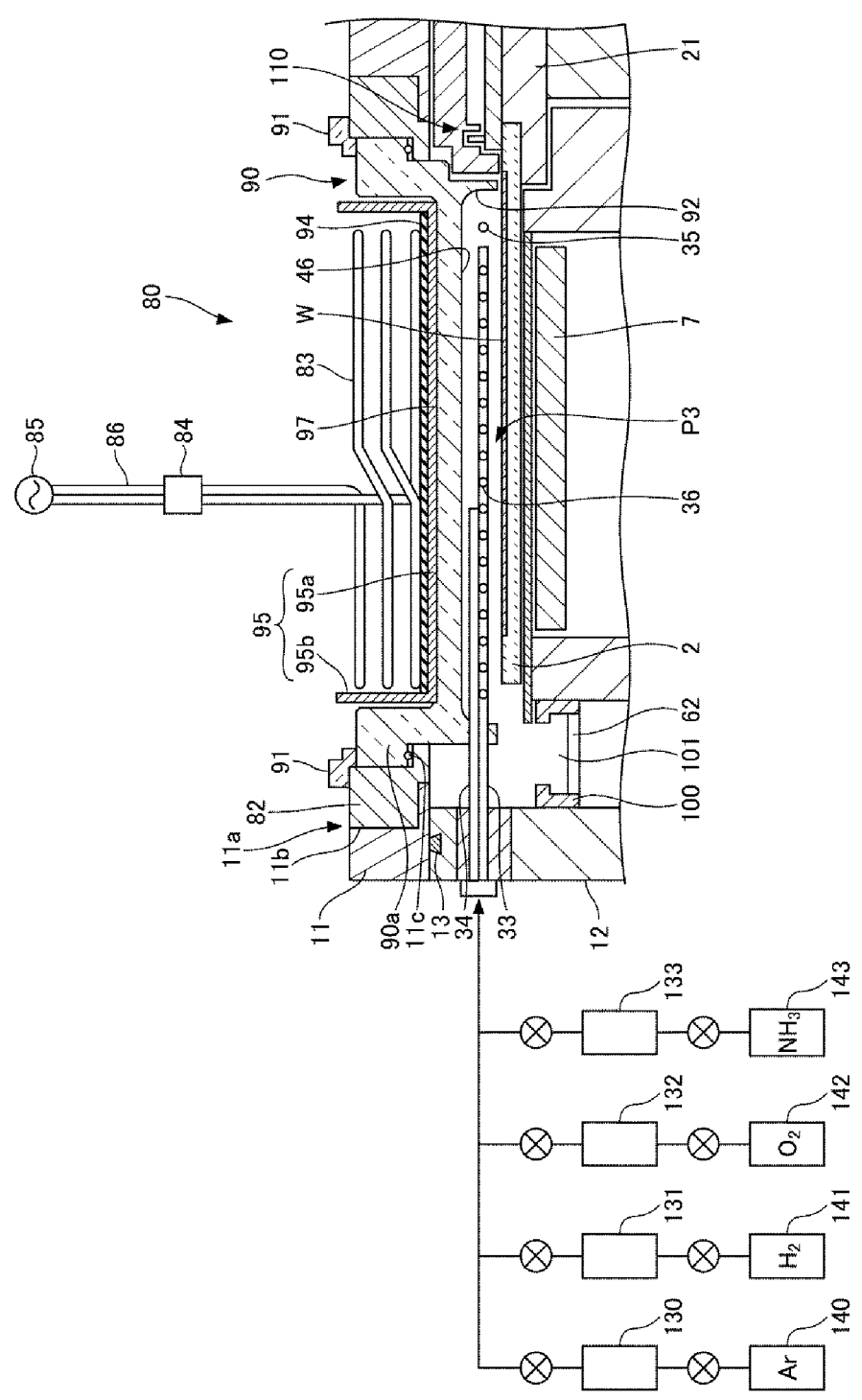
FIG. 4 is a cross-sectional view of a plasma source provided in the plasma processing apparatus illustrated in FIG. 1.

An exemplary plasma processing apparatus according to an embodiment is described with reference to FIGS. 1 to 4. FIG. 1 is a cross-sectional view illustrating an exemplary configuration of the plasma processing apparatus according to an embodiment. FIG. 2 is a plan view of the plasma processing apparatus illustrated in FIG. 1. In FIG. 2, a top board 11 is not illustrated for convenience of description. FIG. 3 is a cross-sectional view taken along a concentric circle of a rotary table 2 in the plasma processing apparatus illustrated in FIG. 1. FIG. 4 is a cross-sectional view of a plasma source 80 provided in the plasma processing apparatus illustrated in FIG. 1.

As illustrated in FIG. 1, the plasma processing apparatus includes a vacuum chamber (e.g., processing chamber) 1 and a rotary table 2. The vacuum chamber 1 has a substantially circular planar shape. The rotary table 2 is provided in the vacuum chamber 1 and has the same rotation center as the vacuum chamber 1. The rotary table revolves a wafer (e.g., a substrate) W in the vacuum chamber 1.

The vacuum chamber 1 is used as a vessel for processing and contains the wafer W. In the vacuum chamber 1, the surface of the wafer W is subjected to deposition processing to deposit a thin film. The vacuum chamber 1 includes a top board 11 and a chamber body 12. The top board 11 is positioned to face a concave portion 24 of the rotary table 2. The chamber body 12 is provided with an annular sealing member 13 along the peripheral edge of the upper surface thereof. The top board 11 is configured to be detachable from the chamber body 12.

The vacuum chamber 1 is connected to a separation gas supply pipe 51 at the center of its upper surface. The separation gas supply pipe 51 supplies the vacuum chamber with a separation gas to prevent different processing gases from mixing in a central region C of the vacuum chamber 1.

The rotary table 2 has a central portion fixed to a core portion 21 with a substantially cylindrical shape. The rotary table 2 is configured to be rotatable about a perpendicular axis, in a clockwise direction in the example illustrated in FIG. 2, with respect to a rotary shaft 22 connected to a lower surface of the core portion 21 and extending in a perpendicular direction, by a driving unit 23.

The driving unit 23 is provided with an encoder 25 that detects the rotation angle of the rotary shaft 22. In the present embodiment, the rotation angle of the rotary shaft 22, which is detected by the encoder 25, is transmitted to a control device 120, and is used to specify the position of the wafers W placed in the concave portions 24 on the rotary table 2. The rotary table 2 is an example of a stage disposed in the processing chamber and used to place the substrate thereon.

The rotary shaft 22 and the driving unit 23 are accommodated in a case body 20. The case body 20 has a flange portion on the upper surface side that is hermetically attached to a lower surface of a bottom surface portion 14 of the vacuum chamber 1. The case body 20 is connected to a purge gas supply pipe 72 that supplies the region below the rotary table 2 with argon (Ar) gas or other similar gases to be used as a purge gas (separation gas). The outer peripheral side of the core portion 21 in the bottom surface portion 14 of the vacuum chamber 1 is formed in an annular shape to allow an approach to the rotary table 2 from below, defining a protrusion 12*a*.

The concave portion 24, which is formed on the surface of the rotary table 2, has a circular shape allowing the wafer W with a diameter of, for example, 300 millimeters (mm) to be placed. The concave portion 24 is provided at a plurality of locations, for example, six locations along the rotation direction of the rotary table 2 (direction indicated by arrow A in FIG. 2). The concave portion 24 has an inner diameter slightly larger, specifically approximately 1 mm to 4 mm greater than the diameter of the wafer W. The concave portion 24 has a depth substantially equal to or greater than the thickness of the wafer W. The concave portion 24 has a bottom surface in which a through hole (not illustrated) is formed. The through hole is configured so that a lift pin (to be described later) passes through. For example, three lift pins push up from below and elevate the wafer W.

As illustrated in FIG. 2, a first processing region P1, a second processing region P2, and a third processing region P3 are spaced apart from each other along the rotation direction of the rotary table 2. A plurality of for example, seven gas nozzles 31, 32, 33, 34, 35, 41, and 42 are arranged to face a passage region of the concave portion 24 in the rotary table 2. These gas nozzles are spaced radially apart in the circumferential direction of the vacuum chamber 1 and made mainly of, for example, quartz.

The gas nozzles 31 to 35, 41, and 42 are arranged between the rotary table 2 and the top board 11. The respective gas nozzles 31 to 34, 41, and 42 are attached so as to extend horizontally, for example, from an outer peripheral wall of the vacuum chamber 1 toward the central region C while facing the rotary table 2. Meanwhile, the gas nozzle 35 extends from the outer peripheral wall of the vacuum chamber 1 toward the central region C and then bends to extend linearly counterclockwise along the central region C (in a direction opposite to the rotation direction of the rotary table 2).

In the example illustrated in FIG. 2, the plasma processing gas nozzles 33, 34, and 35, the separation gas nozzle 41, the first processing gas nozzle 31, the separation gas nozzle 42, and the second processing gas nozzle 32 are arranged in this order in a clockwise direction (rotation direction of the rotary table 2) from a conveying port 15 (to be described later). In many cases, the gas supplied through the second processing gas nozzle 32 is homogeneous with the gas supplied through the plasma processing gas nozzles 33, 34, and 35. However, when the gas is sufficiently supplied through the plasma processing gas nozzles 33, 34, and 35, the second processing gas nozzle 32 may not necessarily be provided.

Furthermore, the plasma processing gas nozzles 33 to 35 may be replaced by a single plasma processing gas nozzle. In such a case, for example, a plasma processing gas nozzle extending from the outer peripheral wall of the vacuum chamber 1 toward the central region C may be provided, similar to the second processing gas nozzle 32. The gas nozzles 31 to 35, 41, and 42 are connected to their respective gas supply sources (not illustrated) via flow-regulating valves (e.g., mass flow controllers).

The gas nozzles 31 to 35, 41, and 42 are provided with gas venting holes 36 formed on their respective lower surface sides (the side facing the rotary table 2) to vent the gas described above. These gas venting holes 36 are provided at a plurality of positions along the radial direction of the rotary table 2, for example, at equal intervals. The gas nozzles 31 to 35, 41, and 42 are arranged such that the distance between their lower edges and the upper surface of the rotary table 2 is, for example, approximately 1 to 5 mm.

The region below the first processing gas nozzle 31 is used as the first processing region P1 for absorbing a raw material gas onto the wafer W. The region below the second processing gas nozzle 32 is used as the second processing region P2 for supplying an oxidizing gas that can oxidize the raw material gas to form an oxide, to the wafer W. In addition, the region below the plasma processing gas nozzles 33 to 35 is used as the third processing region P3 for modifying the thin film on the wafer W.

The first processing gas nozzle 31 supplies a silicon-containing gas upon film deposition of a silicon oxide film or silicon nitride film and supplies a metal-containing gas upon film deposition of a metal oxide film or metal nitride film. Thus, the first processing gas nozzle 31 supplies a raw material gas (precursor) including a raw material that is the main component of the thin film.

In the present embodiment, a molecular layer of an oxide film is deposited on the wafer W in the second processing region P2. In addition, the oxide film used for the film deposition allows the plasma processing gas supplied from the plasma processing gas nozzles 33 to 35 to be, for example, an oxygen-containing gas. Meanwhile, for the film deposition of a nitride film, the plasma processing gas supplied from the plasma processing gas nozzles 33 to 35 is, for example, a nitrogen-containing gas.

The separation gas nozzles 41 and 42 are provided to form a separation region D that separates the third processing region P3 from the first processing region P1 and the first processing region P1 from the second processing region P2. The separation gas supplied from the separation gas nozzles 41 and 42 is an inert gas such as nitrogen, or a noble gas such as helium and argon. The separation gas also serves as a purge gas. No separation region D is provided between the second processing region P2 and the third processing region P3. Since the oxidizing gas supplied in the second processing region P2 and a mixed gas supplied in the third processing region P3 both contain oxygen gas having oxygen atoms in common, both gases function as oxidizing agents. Therefore, it is not necessary to use such separation gas to separate the second processing region P2 and the third processing region P3.

The configuration of the plasma processing gas nozzles 33 to 35 that supply gases to different regions on the rotary table 2 can make the flow ratio of each component of the mixed gas different for each region, enabling gas supply for the uniform modification treatment throughout.

FIG. 3 is a cross-sectional view taken along a concentric circle of the rotary table 2 included in the plasma processing apparatus of FIG. 1 and illustrates a cross-section taken from one separation region D via the first processing region P1 to another separation region D. The top board 11 of the vacuum chamber 1 in the separation area D is provided with a convex portion 4 having a substantial fan shape. The convex portion 4 is attached to the back surface of the top board 11. In the vacuum chamber 1, a ceiling surface forming the lower surface of the convex portion 4 (hereinafter referred to as "first ceiling surface 44") and a ceiling surface located on both sides of the first ceiling surface 44 in the circumferential direction (hereinafter referred to as "second ceiling surface 45") are provided. The first ceiling surface 44 is flat and positioned lower than the second ceiling surface 45.

The convex portion 4 that forms the first ceiling surface 44 has a fan-like planar shape with an arc-shaped top portion, as illustrated in FIG. 2. The convex portion 4 has a groove portion 43 formed to extend in the radial direction at the center circumferentially. The separation gas nozzles 41 and 42 are accommodated in the groove portions 43. The peripheral edge of the convex portion 4 (the part on the outer edge side of the vacuum chamber 1) is bent in an L shape to face the outer end surface of the rotary table 2 and be slightly separated from the chamber body 12, preventing the processing gases from mixing.

A nozzle cover 230 is provided above the first processing gas nozzle 31 to allow the first processing gas to flow along the wafer W and the separation gas to direct toward the top board 11 of the vacuum chamber 1 while avoiding the vicinity of the wafer W. The nozzle cover 230 includes a cover body 231 and a straightening vane 232, as illustrated in FIG. 3. The cover body 231 has a substantially box-like shape with an open bottom side in which the first processing gas nozzle 31 is accommodated. The straightening vane 232 is a plate-like structure connected individually to the upstream and downstream sides in the rotation direction of the rotary table 2 at the open end on the lower surface side of the cover body 231. The cover body 231 has a side wall surface extending toward the rotary table 2 on the rotation center side of the rotary table 2 to face the tip of the first process gas nozzle 31. In addition, the cover body 231 has another side wall surface notched on the outer edge side of the rotary table 2 to prevent interference with the first processing gas nozzle 31. The nozzle cover 230 does not necessarily need to be equipped and can be provided as required.

As illustrated in FIG. 2, a plasma source 80 is provided above the plasma processing gas nozzles 33 to 35 to form plasma from the plasma processing gas ejected into the vacuum chamber 1. The plasma source 80 uses an antenna 83 to generate an inductively coupled plasma.

FIG. 4 is a cross-sectional view of the plasma source 80 provided in the plasma processing apparatus illustrated in FIG. 1. The plasma source 80 includes the antenna 83. The antenna 83 is provided in the upper part of the vacuum chamber 1 and configured using a metal wire or other suitable material, which is wounded around a perpendicular axis, typically three times, to form a coil shape. In addition, the plasma source 80 is arranged to enclose a belt shape region extending in the diameter direction of the rotary table 2 when viewed from a plan view and to cross the diameter of the wafer W on the rotary table 2.

The antenna 83 is connected via a matching unit 84 to an RF power supply 85 configured to supply RF power having a frequency of, for example, 13.56 MHz. The antenna 83 is provided to be hermetically partitioned from the inner region of the vacuum chamber 1. In FIG. 4, a connection electrode 86 is provided to electrically connect the antenna 83 to the matching unit 84 and the RF power supply 85.

The antenna 83 can be provided, as required, with at least one of a vertically bendable structure, a vertical movement mechanism capable of automatically bending the antenna 83 vertically, or a mechanism capable of moving a portion on the center side of the rotary table 2 vertically. Such structures or mechanisms are omitted in FIG. 4.

As illustrated in FIG. 4, the top board 11 is provided with an opening 11a defined above the upper side of the plasma processing gas nozzles 33 to 35. The opening 11a is substantially fan-shaped when viewed from a plan view. As illustrated in FIG. 4, the opening 11a has an annular member 82 that is hermetically provided in the opening 11a along the periphery of the opening 11a. A housing 90 is hermetically provided on the inner circumferential surface side of the annular member 82. In other words, the annular member 82 is provided in a hermetical manner by having an outer peripheral side in contact with an inner peripheral surface 11b of the opening 11a of the top board 11 and an inner peripheral side in contact with a flange portion 90a to be described later of the housing 90. Then, the housing 90 is provided in the opening 11a using the annular member 82 as an intermediary so that the antenna 83 is located lower than the top board 11. The housing 90 is mainly made of a dielectric material, for example, quartz or other similar material. The housing 90 has a bottom surface that constitutes a ceiling surface 46 of the third processing region P3.

The atmosphere inside the vacuum chamber 1 is set to be hermetical by the annular member 82 and the housing 90. Specifically, the annular member 82 and the housing 90 are fitted into the opening 11a, and then the housing 90 is pressed by a pressing member 91 downward along the circumferential direction. The pressing member 91 is formed on the upper surfaces of the annular member 82 and the housing and has a frame shape along a portion where the annular member 82 and the housing are in contact. Furthermore, the pressing member 91 is fixed to the top board 11 with a bolt (not illustrated) or other similar fasteners. Consequently, the atmosphere inside the vacuum chamber 1 is allowed to be set to be hermetical.

The housing 90 is provided with a projection portion 92 formed on the lower side (the plasma processing region P3 side) of the housing 90 along its circumferential direction, as illustrated in FIG. 4. The projection portion 92 keeps a sealing member 11c from being directly exposed to the plasma, isolating the sealing member 11*c* from the plasma processing region P3. Thus, in one example, even if any plasma diffuses from the plasma processing region P3 to the side of the sealing member 11*c*, the plasma is caused to travel below the projection portion 92. Thus, the plasma is deactivated before the plasma reaches the sealing member 11*c*.

Further, as illustrated in FIG. 4, the plasma processing gas nozzles 33 to 35 are provided in the third processing region P3 below the housing 90 and are connected to an argon gas supply source 140, a hydrogen gas supply source 141, an oxygen gas supply source 142, and an ammonia gas supply source 143. Meanwhile, it is possible to provide at least one of either the hydrogen gas supply source 141 or the ammonia gas supply source 143, so they both need not necessarily be provided.

Further, flow rate controllers 130, 131, 132, and 133 are provided between the plasma processing gas nozzles 33 to 35 and the argon gas supply source 140, the hydrogen gas supply source 141, the oxygen gas supply source 142, and the ammonia gas supply source 143. The flow rate controllers 130, 131, 132, and 133 are used for the supply sources 140, 141, 142, and 143, respectively. The argon gas supply source 140, the hydrogen gas supply source 141, the oxygen gas supply source 142, and the ammonia gas supply source 143 are configured to supply Ar, $H_2$, $O_2$, and $NH_3$ gases, respectively, to the plasma processing gas nozzles 33 to 35. The Ar, $H_2$, $O_2$, and $NH_3$ gases are supplied to the plasma processing gas nozzles 33 to 35 at their respective predetermined flow ratios (mixing ratios). The flow rates of Ar, $H_2$, $O_2$, and $NH_3$ gases are controlled by the flow rate controllers 130, 131, 132, and 133, respectively. However, if either the hydrogen gas supply source 141 or the ammonia gas supply source 143 is provided as described above, the flow rate controller 131 or 133 corresponding to the provided gas supply source is provided accordingly. For the flow rate controllers 130-133, a mass flow controller can be used as an example.

As illustrated in FIG. 4, there is provided a Faraday shield 95 provided on the upper side of the housing 90. The Faraday shield 90 is grounded and is mainly made of a metal plate, for example, copper or other similar material, which is a conductive plate-shaped body formed to substantially conform to the inner shape of the house 90. The Faraday shield 95 has a horizontal surface 95*a* and a vertical surface 95*b*. The horizontal surface 95*a* is horizontally latched along the bottom surface of the housing 90, and the vertical surface 95*b* extends upward in the circumferential direction from the outer end of the horizontal surface 95*a*. The Faraday shield 95 can have, for example, a substantially hexagonal shape when viewed from a plan view.

As illustrated in FIGS. 1 and 2, there is provided a side ring 100 configured to act as a cover body is arranged lower than the rotary table 2 on the outer peripheral side of the rotary table 2. The side ring 100 is provided with a first exhaust port 61 and a second exhaust port 62 formed on the upper surface of the side ring 100 to be spaced apart from each other in the circumferential direction.

The first exhaust port 61 is formed between the first processing gas nozzle 31 and the separation region D located downstream of the first processing gas nozzle 31 in the rotation direction of the rotary table 2. The first exhaust port 61 is positioned closer to the separation region D than the first processing gas nozzle 31. The second exhaust port 62 is formed between the plasma source 80 and the separation region D located downstream of the plasma source 80 in the rotation direction of the rotary table 2. The second exhaust port 62 is positioned closer to the separation region D than the plasma source 80.

The first exhaust port 61 is an outlet that releases the first processing gas or the separation gas. The second exhaust port 62 is an outlet that vents the plasma processing gas or the separation gas. As illustrated in FIGS. 1 and 2, the first exhaust port 61 and the second exhaust port 62 are each coupled to, for example, a vacuum pump 64 acting as a vacuum exhaust mechanism. In this case, the coupling is performed through an exhaust pipe 63 in which a pressure regulator 65, such as a butterfly valve, is interposed between the exhaust pipe 63 and the vacuum pump 64.

As described above, the housing 90 is arranged from the central region C side to the outer edge side, so, in some cases, the gas flowing from the upstream side in the rotation direction of the rotary table 2 to the second processing region P2 is blocked from flowing toward the second exhaust port 62 due to the housing 90. Thus, there is provided a groove-shaped gas flow path 101 formed on the upper surface of the side ring 100 that is further outward than the housing 90, allowing gas to flow.

As illustrated in FIG. 1, the top board 11 is provided with a protrusion 5 formed at the central portion in the lower surface of the top board 11. The protrusion 5 has a substantially annular shape in the circumferential direction continuously with a portion of the convex portion 4 on the side of the central region C and has a lower surface flushed with the lower surface of the convex portion 4 (the first ceiling surface 44). There is provided a labyrinth structure 110 arranged above the core 21 at a position closer to the center of rotation of the rotary table 2 than the projecting portion 5. The labyrinth structure 110 reduces or prevents different gases from mixing in the central region C.

As described above, the housing 90 is formed to extend to a position close to the central region C, and so, the core portion 21 that supports the central portion of the rotary table 2 is located near the center of rotation to prevent the upper part of the rotary table 2 from being in contact with the housing 90. Thus, different gases are more likely to mix with each other near the center region C rather than near the outer edge. For this reason, the labyrinth structure 110 formed above the core portion 21 makes it possible to extend the gas flow path, preventing the gases from mixing with each other.

As illustrated in FIG. 1, there is provided a heater unit 7 provided in the space between the rotary table 2 and the bottom surface portion 14 of the vacuum chamber 1, acting as a heating mechanism. The heater unit 7 is configured to heat the wafer W mounted on the rotary table 2 in a temperature range of, for example, room temperature to approximately 700° C. via the rotary table 2. As illustrated in FIG. 1, there is provided a cover portion 71 on the lateral side of the heater unit 7, and there is provided a covering member 7*a* to cover the upper side of the heater unit 7. Additionally, there is provided a purge gas supply pipe 73 to clear out the space where the heater unit 7 is disposed. The purge gas supply pipes 73 are provided below the heater unit 7 and are positioned in the bottom surface portion 14 of the vacuum chamber 1 at multiple locations along the circumferential direction.

As illustrated in FIG. 2, the conveying port 15 is provided on the side wall of the vacuum chamber 1 to transfer the wafer W between a conveying arm 10 and the rotary table 2. The conveying port 15 is configured to be hermetically opened and closed by a gate valve G.

The wafer W is conveyed between the conveying arm 10 and the concave portion 24 of the rotary table 2 at a position where the concave portion 24 faces the conveying port 15. To this end, a lift pin and a lift mechanism (not illustrated) are provided at a portion corresponding to the delivery position under the rotary table 2 to elevate the wafer W from the back surface through the concave portion 24.

Further, the plasma processing apparatus according to the present embodiment is provided with the control device 120 that functions as a computer configured to control the entire operation of the plasma processing apparatus. The control device 120 has a memory that stores a program used to perform substrate processing described later. The program has a set of steps or instructions allowing the plasma processing apparatus to execute various operations. The program is loaded onto the control device 120 from a storage unit 121, which can be in the form of a storage medium such as a hard disk, compact disk, magneto-optical disk, memory card, flexible disk, or other similar media. The storage unit 121 stores correlation information 122 indicating a correlation between RF power and a Vpp voltage described later.

[Matching Unit]

Figure 5:
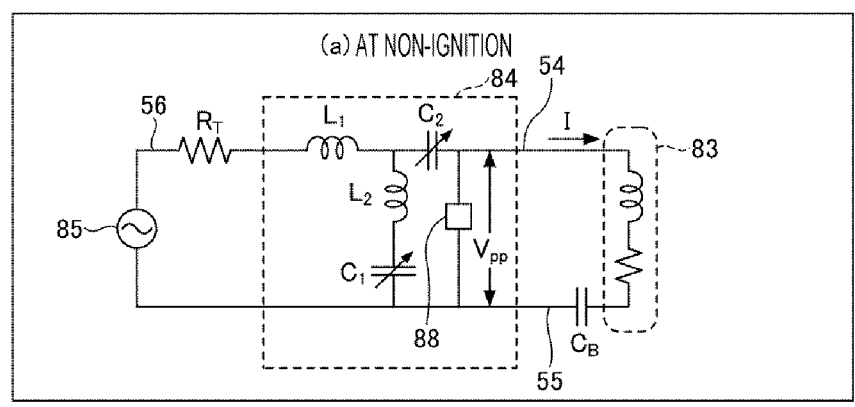
FIG. 5 is a circuit diagram of a matching unit provided in the plasma processing apparatus illustrated in FIG. 1.
Figure 5:
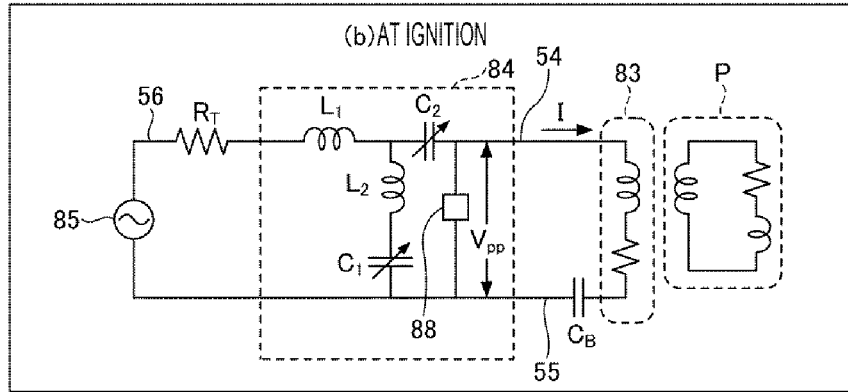

Referring to FIG. 5, descriptions will be made on the circuit configuration of the matching unit 84 provided in the plasma processing apparatus illustrated in FIG. 1, and on the plasma ignition state and plasma non-ignition state. In FIG. 5, (a) illustrates a plasma non-ignition state, that is, a state where the plasma P is not generated, and (b) illustrates a plasma ignition state, that is, a state where the plasma P is generated.

The matching unit 84 is arranged between the RF power supply 85 and the antenna 83. The antenna 83 is connected to the RF power supply 85 via the matching unit 84 and is supplied with the RF power from the RF power supply 85.

The matching unit 84 is connected in series between the RF power supply 85 and the antenna 83 via voltage supply lines 54, 55, and 56. The matching unit 84 includes a first variable capacitor $C_1$, a second variable capacitor $C_2$, a coil $L_1$, and a coil $L_2$. However, the circuit configuration of the matching unit 84 is an example, and the number and positions of variable capacitors and coils are not limited to this exemplary configuration. There is provided a block capacitor $C_B$ between the voltage supply line 55 and the antenna 83 to adjust the impedance. In addition, the voltage supply line 56 has a resistance component such as a resistor $R_T$.

In supplying the RF power from the RF power supply 85 to a plasma load (the side of plasma P: see (b) of FIG. 5) via the antenna 83, the matching unit 84 matches the impedance between the RF power supply 85 and the plasma load, increasing the efficiency of the RF power supply.

Furthermore, the matching unit 84 includes a voltmeter 88, which is an example of an instrument used to measure a voltage at the output terminal of the matching unit 84. The peak-to-peak voltage of the output terminal voltage of the matching unit 84 measured by the voltmeter 88 is also referred to as "Vpp" or "Vpp voltage".

Figure 6:
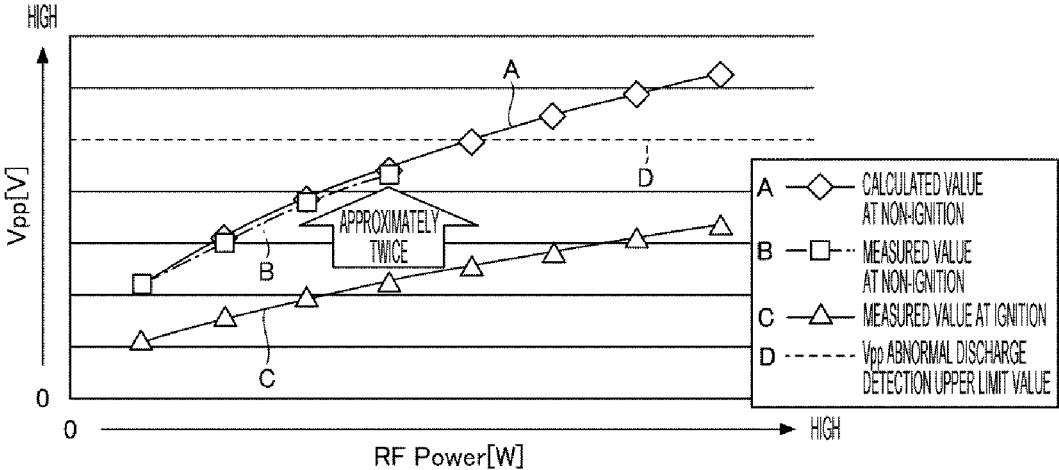
FIG. 6 is a diagram illustrating an example of the correlation between RF power and Vpp voltage at plasma ignition and plasma non-ignition.

Referring to FIG. 6, descriptions will be made on the correlation between the RF power and the Vpp voltage during a plasma ignition state and a plasma non-ignition state. A correlation table, which is an example of the correlation information 122 indicating the correlation between the RF power and the Vpp voltage as illustrated in FIG. 6, is stored in, for example, the storage unit 121 (see, e.g., FIG. 1).

In FIG. 6, the horizontal axis represents the RF power [W] supplied from the RF power supply 85 to the antenna 83, and the vertical axis is the Vpp voltage [V]. Line A denotes values obtained by calculating the Vpp voltage at the non-ignition state, and Line B denotes values obtained by measuring the Vpp voltage at the non-ignition state. At the non-ignition state, a calculated value of the Vpp voltage is approximately consistent with a measured value of the Vpp voltage.

Line C denotes values obtained by measuring the Vpp voltage at the ignition state, and Line D denotes a Vpp abnormal discharge detection upper limit value used to prevent abnormal discharge. The measured value of the Vpp voltage at the non-ignition state is the peak-to-peak voltage of the output terminal voltage measured by the voltmeter 88 at the non-ignition state illustrated in (a) of FIG. 5. The measured value of the Vpp voltage at the ignition state is the peak-to-peak voltage of the output terminal voltage measured by the voltmeter 88 at the ignition state illustrated in (b) of FIG. 5. As illustrated in FIG. 6, in the case of applying the same RF power, the Vpp voltage at the non-ignition state has been found to be approximately twice as high as the Vpp voltage at the ignition state. This is due to the contribution to the impedance as a substantial conductor by the plasma P upon generation of an inductively coupled plasma (ICP; hereinafter referred to as "ICP plasma") using the antenna 83 illustrated in (b) of FIG. 5. Meanwhile, in the case where no plasma is generated as illustrated in (a) of FIG. 5, the insulating gas contained in the plasma space does not contribute to the impedance. This suggests that the Vpp voltage at the non-ignition state was approximately twice as high as the Vpp voltage at the ignition state.

Hereinafter, the state where "ICP plasma" is generated, that is, the state of the Vpp voltage at the plasma ignition state is referred to as "ICP mode." The state where the ICP plasma is not generated is referred to as "non-ignition state." Thus, the non-ignition state is herein used to include a state where "CCP plasma" is generated and a state where plasma is extinguished (no generated plasma). The state where "CCP plasma" is generated at the non-ignition state is referred to as a "CCP mode." The "CCP mode" and the "ICP mode" have different plasma properties. In the CCP mode, a capacitively coupled plasma (CCP plasma) is generated due to a voltage difference caused by the magnetic field between the antenna 83 and the ground. In the ICP mode, the antenna 83 is used to generate the inductively coupled plasma (ICP plasma).

The plasma generated in the ICP mode has stronger properties than that generated in the CCP mode. Thus, for example, when the plasma process, which is to be performed in the ICP mode, is actually performed in the CCP mode, the intended process outcome may not be achieved.

Thus, by monitoring the Vpp voltage from the output terminal voltage of the matching unit 84, which is measured by the voltmeter 88, it may be determined whether the mode is the ICP mode or the CCP mode. In this case, as described above, it is possible to determine whether the mode is "ICP mode" or "CCP mode" based on the values of the Vpp voltage by referring to the correlation table of FIG. 6. In addition, when determined that the Vpp voltage exceeds the Vpp abnormal discharge detection upper limit value denoted by line D in FIG. 6, an abnormal discharge may occur, so that the Vpp voltage is controlled to be prevented from exceeding the Vpp abnormal discharge detection upper limit value.

The plasma generated in the ICP mode has stronger properties than that generated in the CCP mode. Thus, the plasma in the ICP mode may potentially cause significant damage to the dielectric such as quartz used to form the housing 90, depending on the type of gas supplied.

11

Figure 7:
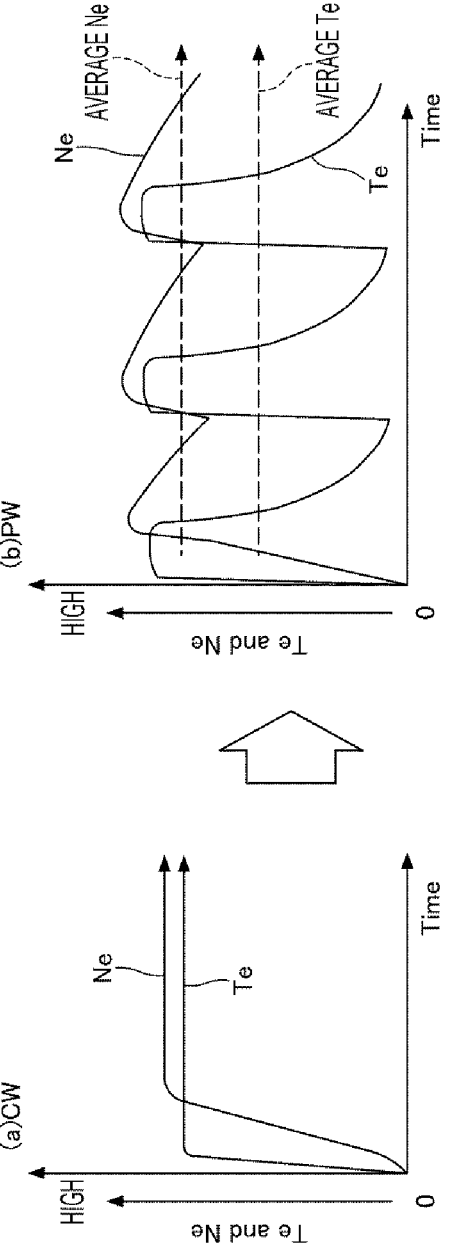
FIG. 7 is a diagram illustrating an example of the average electron density and average electron temperature of continuous and pulsed waves of RF power.

For this reason, in order to minimize the damage caused by the plasma to the housing 90 or to act as a film quality adjustment knob during film deposition on the wafer W, a pulsed wave of the RF power (hereinafter also referred to as "pulsed RF power") is supplied to the antenna 83. FIG. 7 is a diagram illustrating an example of average electron densities and average electron temperatures for continuous waves and pulsed waves of the RF power. The continuous wave of the RF power is also referred to as "CW", and the pulsed wave of the RF power is also referred to as "PW" hereinafter. As illustrated in (a) of FIG. 7, in the case where CW (continuous wave of RF power) is applied to the antenna 83, the electron density Ne and the electron temperature Te remain constant during plasma generation. Meanwhile, as illustrated in (b) of FIG. 7, in the case where PW (pulsed wave of RF power) is supplied, periodic fluctuations occur in the electron density Ne and the electron temperature Te during plasma generation. The average value of the electron densities Ne (average Ne) denoted by the dotted line in (b) of FIG. 7 is substantially identical to the electron density Ne denoted in (a) of FIG. 7. Meanwhile, the average value of the electron temperatures Te (average Te) in (b) of FIG. 7 is lower than the electron temperature Te denoted in (a) of FIG. 7. This is because electrons are smaller and lighter than ions or the like and disappear instantly upon colliding with wall surfaces or other similar portions in the vacuum chamber. Meanwhile, ions or atomic nuclei have a larger mass than electrons, so it takes relatively longer for the ions or atomic nuclei to be disappeared after colliding with wall surfaces or the like. For this reason, electrons with collision energy disappear earlier than ions or the like during the off time of the pulsed RF power. As a result, colliding electrons near the surroundings of the housing or the substrate disappear, thus reducing the damage to the housing 90 made of quartz or the substrate. Meanwhile, the electron temperature Te decreases. When the pulsed RF power is turned ON before the ions disappear, the ion reaction may continue, the electron density Ne may be maintained. Consequently, during the supply of the pulsed RF power, the average value of the electron temperature Te decreases, while the average value of the electron density Ne remains constant, as denoted in (b) of FIG. 7.

Figure 8:
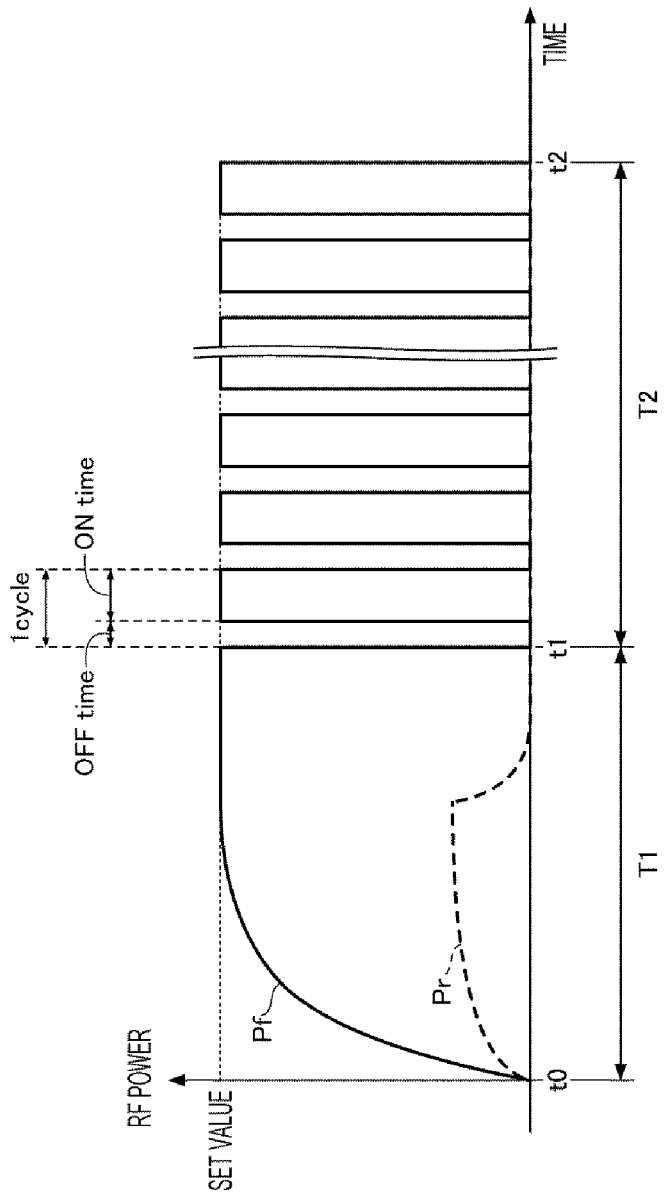
FIG. 8 is a diagram illustrating an exemplary output of a pulsed wave of RF power in a monitoring method according to an embodiment.

In this case, supplying the pulsed RF power causes the Vpp voltage to decrease as the off time increases. In one example, FIG. 8 is a diagram illustrating an example of an output of the pulsed RF power in a monitoring method according to an embodiment. In FIG. 8, the horizontal axis represents time, and the vertical axis represents the output of RF power (pulsed RF power) output by the RF power supply 85. Moreover, in FIG. 8, the solid line denotes a progressive-wave power Pf delivered from the RF power supply 85 to the plasma load, including the antenna 83, while the dashed line denotes a reflected-wave power Pr that is directed from the plasma load to the RF power supply 85.

In this figure, a period T1 is a standby time before a process is processed, starting at time t0 and ending at time t1 (e.g., 0.5 seconds), and a period T2 is a period while the process is processed starting at time t1 and ending at time t2 (processing period). In the period T2, a pulsed wave of the RF power (progressive-wave power Pf) is supplied from the RF power supply 85. During the processing in the period T2, the pulsed RF power with a duty ratio determined by the following formula (a) is supplied, where one on-time (ON time) and one off-time (OFF time) form one cycle.

$$\text{Duty ratio} = \text{ON time}/(\text{ON time} + \text{OFF time}) \qquad \text{(a)}$$

12

It has been found out that a decrease in the duty ratio of the pulsed RF power shortens the turn-ON time of the RF power output from the RF power supply 85, lowering the Vpp voltage. The correlation table of FIG. 6 illustrates the correlation (correlation information 122) between the RF power and the Vpp voltage in the case where the RF power is a continuous wave. Thus, in the case of monitoring the plasma based on the Vpp voltage of the output terminal voltage measured during the pulsed-wave RF power using the correlation table of FIG. 6 without any conversion, it may be difficult to determine the mode correctly, and a stable monitoring of plasma may become difficult.

To solve such a challenge, the present embodiment provides a monitoring method allowing a stable control of plasma process using the pulsed wave of the RF power. In the monitoring method according to the present embodiment, a converted value of the Vpp voltage is calculated from the measured value of the Vpp voltage using Formula (1).

$$Vpp \text{ converted value} = Vpp \text{ measured value } \frac{1}{\text{duty ratio}} \times K \qquad (1)$$

In Formula (1), K is a constant, for example, 1.12. K is a predetermined experimental value used to establish the correlation between the RF power and the Vpp voltage illustrated in FIG. 6 in the case where a Vpp converted value obtained by calculating the converted value of the Vpp voltage from the measured value of the Vpp voltage is applied to the Vpp voltage in the correlation table of FIG. 6. As described above, the correlation table of FIG. 6 is an example of the correlation information 122 between the RF power and the Vpp voltage. The correlation information 122 is not limited to the correlation table of FIG. 6.

Using Formula (1) above, the converted value of the Vpp voltage is obtained from the measured value of the Vpp voltage based on the duty ratio obtained from Formula (2). This allows a stable monitoring of the ICP plasma using the correlation table of FIG. 6, even in a situation where continuous waves are changed into pulsed waves or vice versa for the RF power.

The matching unit 84 illustrated in FIG. 5 is capable of performing matching without the reflected-wave power Pr during the plasma processing in the period T2. Thus, mode discrimination may not be monitored according to the state of the reflected-wave power Pr. In addition, for the mode monitoring using plasma light monitoring, it is difficult to set a threshold value to be used for mode discrimination because the plasma light fluctuates significantly depending on the film deposition state or other similar conditions of the substrate W. Meanwhile, the Vpp voltage of the output terminal voltage of the matching unit 84 is substantially less affected by the type of gas, pressure, and type of substrates. For this reason, the correlation table indicating a correlation between the RF power and the Vpp voltage is stored for each RF power in advance, and the RF power and the measured value of Vpp voltage are subjected to the correlation table (see, e.g., FIG. 6), which enables a stable monitoring of the ICP plasma. Furthermore, for a decrease in the Vpp voltage that may occur in the case where the process condition is changed from a continuous wave to a pulsed wave for the RF power, the converted value of the Vpp voltage is calculated using Formula (1). Thus, the converted value of the Vpp voltage is applied to the correlation table (see, e.g., FIG. 6), which makes it possible to use a correlation table identical to the case of supplying continuous waves of the RF power, thus a stable monitoring of the ICP plasma may be achieved. The monitoring method according to the present embodiment is now described in detail.

[Monitoring Method]

The monitoring method according to the present embodiment includes at least steps (a) to (c) as follows:

(a) placing a substrate on a stage (the rotary table 2);

(b) supplying a pulsed wave of RF power with a predetermined duty ratio from the RF power supply 85; and (c) monitoring a plasma state based on a converted value of a Vpp voltage, the RF power obtained by converting the Vpp voltage of an output terminal voltage of the matching unit 84 measured by the voltmeter 88 based on the duty ratio, and correlation information indicating a correlation between the Vpp voltage and the RF power.

The monitoring method according to the present embodiment may further include steps (d) and (e) as follows:

(d) stop supplying the pulsed wave of the RF power from the RF power supply 85 and supplying the continuous wave of the RF power from the RF power supply 85; and (e) monitoring the state of the plasma based on the Vpp voltage of the output terminal voltage, the RF power, and the correlation information after executing (d).

Figure 9:
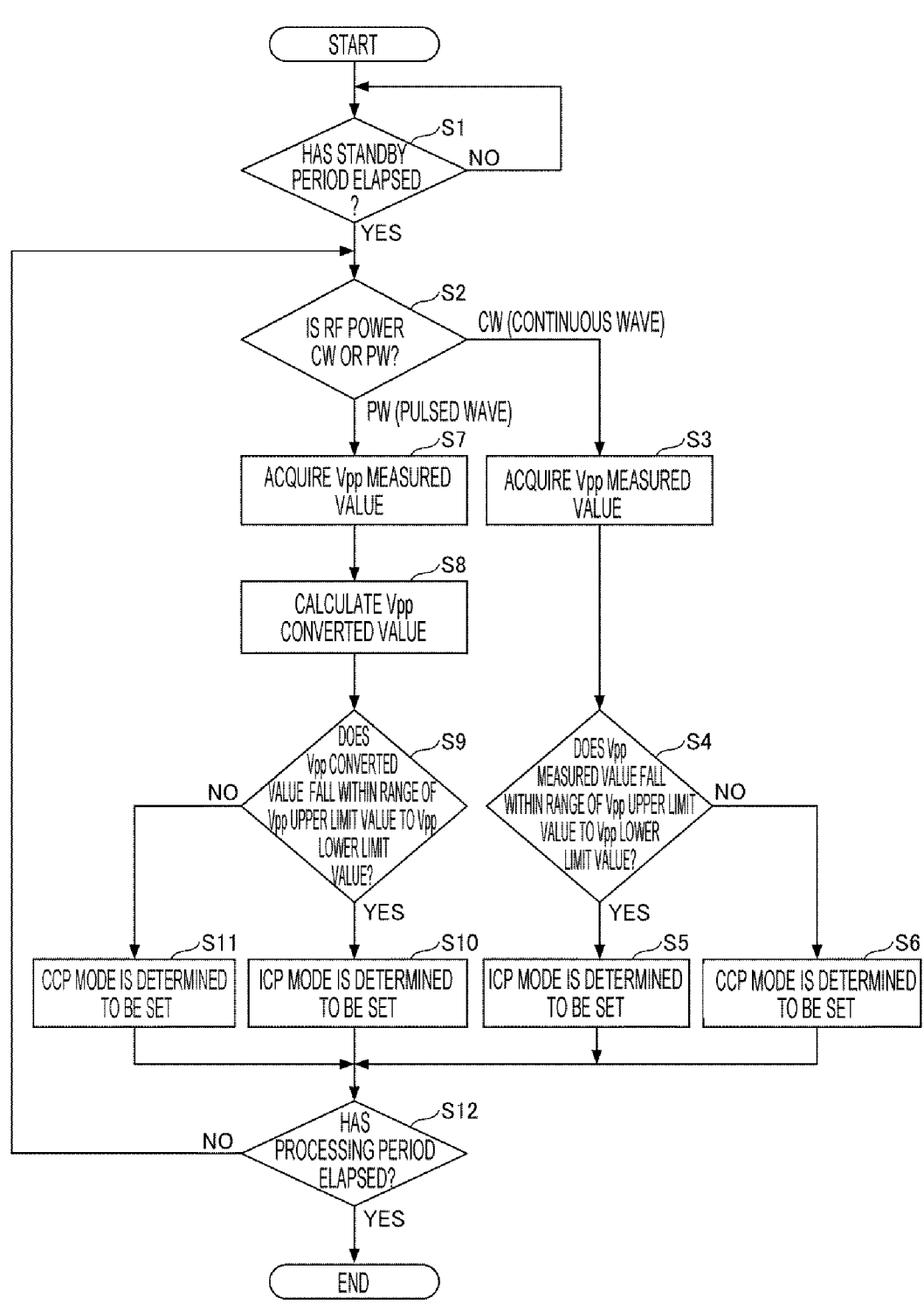
FIG. 9 is a flowchart illustrating an example of the monitoring method according to an embodiment.
Figure 10:
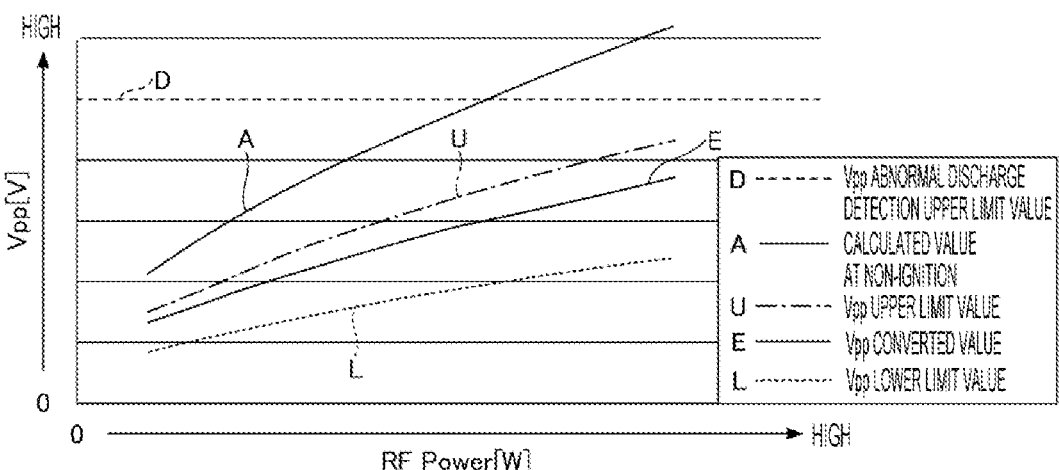
FIG. 10 is a diagram illustrated to describe how to determine the plasma state using the monitoring method illustrated in FIG. 9.

Examples of the monitoring method according to the present embodiment are described in detail with reference to FIGS. 9 and 10. FIG. 9 is a flowchart illustrating an example of the monitoring method according to an embodiment. FIG. 10 is a diagram illustrated to describe the determination of the plasma state using the monitoring method of FIG. 9.

Each process of the monitoring method in FIG. 9 is controlled by the control device 120. If the monitoring method of FIG. 9 is started, then in step S1, the control device 120 determines whether the standby period (period T1 in FIG. 8) has elapsed. Step (a) mentioned above is performed prior to step S1.

In step S1, the control device 120 stands by until the standby period (period T1 in FIG. 8) elapses, and if the standby period elapses, the flow proceeds to step S2 to determine whether the RF power supplied from the RF power supply 85 is CW (continuous wave) or PW (pulsed wave).

In step S2, when the control device 120 determines that the RF power is CW (continuous wave), then the flow proceeds to step S3. Meanwhile, when the control device 120 determines in step S2 that the RF power is PW (pulsed wave), then the flow proceeds to step S7.

In step S3, the control device 120 acquires a measured value of the Vpp voltage from the output terminal voltage of the matching unit 84, which is measured by the voltmeter 88. Then, in step S4, the control device 120 determines whether the measured value of the Vpp voltage falls within the range of a Vpp upper limit value to a Vpp lower limit value, inclusive. The correlation table of FIG. 6 is obtained through experiments and stored in the storage unit 121 in advance. The Vpp upper and lower limit values are determined based on the measured value of the Vpp voltage at ignition, denoted by line C in FIG. 6. Specifically, the upper and lower limits are set at ±30% of this measured value. In other words, the Vpp upper limit value is 1.3 times (×0.3) the measured value at ignition, and the Vpp lower limit value is 0.7 times (×0.7) the measured value at ignition. However, the setting method on how to set the Vpp upper and lower limit values is not limited to this example. An example of the Vpp upper limit values (line U) and the Vpp lower limit values (line L) is illustrated in FIG. 10.

In step S4, when it is determined that the measured value of the Vpp voltage falls within the range of the Vpp upper limit value to the Vpp lower limit value, inclusive, then in step S5, the control device 120 determines that the mode is set to the ICP mode and ICP plasma is generated. After such determination, the flow proceeds to step S12.

In step S4, when it is determined that the measured value of the Vpp voltage exceeds the Vpp upper limit value or falls below the Vpp lower limit value, then in step S6, the control device 120 determines that the CCP mode is set, and CCP plasma is generated. After the determination, the flow proceeds to step S12.

In the case where the RF power is PW (pulsed wave), in step S7, the control device 120 acquires a measured value of the Vpp voltage from the output terminal voltage of the matching unit 84, which is measured by the voltmeter 88. Then, in step S8, the control device 120 calculates a converted value of the Vpp voltage using Formula (1).

Subsequently, in step S9, the control device 120 determines whether the converted value of the Vpp voltage falls within the range of the Vpp upper limit value to the Vpp lower limit value, inclusive. When it is determined that the converted value of the Vpp voltage falls within the range of the Vpp upper limit value to the Vpp lower limit value, then in step S10, the control device 120 determines that the ICP mode is set and the ICP plasma is generated. After the determination, the flow proceeds to step S12.

In step S9, when it is determined that the converted value of the Vpp voltage exceeds the Vpp upper limit value or falls below the Vpp lower limit value, then in step S11, the control device 120 determines that the CCP mode is set and CCP plasma is generated. After the determination, the flow proceeds to step S12.

In step S12, the control device 120 determines whether the processing period (period T2 in FIG. 8) has elapsed. The control device 120 repeats the processing of steps S2 to S12 until the processing period elapses and terminates this processing upon determination of the lapse of the processing period in step S12.

In steps S6 and S11, it is possible to determine that the plasma is extinguished (plasma is not generated) instead of determining that the CCP mode is set. In the case where, after applying the RF power by presetting the matched position of the matching unit 84 in a non-ignition state in advance, the plasma is non-ignited or the CCP mode is set, the Vpp becomes higher than the threshold. Meanwhile, in this case, if the plasma is extinguished from the normally matched condition in the ICP plasma state, the Vpp becomes lower than the threshold. The case where the plasma is extinguished in the process of igniting and matching plasma from non-ignition corresponds to one of the cases above, while even in this case, the reflected wave continues to appear. Thus, detecting the reflected wave by the RF power supply 85 and acquiring the detected value of this reflected wave by the control device 120 make it possible to determine that the matching is abnormal to issue an alarm.

FIG. 10 illustrates a correlation table that is an example of the correlation information 122 indicating a correlation between the RF power and the Vpp voltage. In this figure, line A denotes the calculated value of the Vpp voltage at non-ignition, line E denotes the converted value of the Vpp voltage obtained by converting the measured value of the Vpp voltage at ignition, line D denotes the Vpp abnormal discharge detection upper limit value used to prevent abnormal discharge, line U is the Vpp upper limit value, and line L is the Vpp lower limit value.

In the monitoring method of FIG. 9, when the converted value of the Vpp voltage is determined to fall within a region surrounded by lines U and L for the supplied RF power, then the ICP mode is determined to be set. When the converted value of the Vpp voltage is determined to be outside the region surrounded by lines U and L, the CCP mode is determined to be set (or the plasma is extinguished).

When the converted value of the Vpp voltage exceeds the Vpp abnormal discharge detection upper limit value denoted by line D, it is determined that abnormal discharge occurs. In this case, the control device 120 is capable of reducing or preventing abnormal discharge by managing the RF power so that the RF power to be supplied is not higher than the Vpp abnormal discharge detection upper limit value.

The monitoring method described above uses Formula (1) to calculate the converted value of the Vpp voltage (the Vpp converted value) from the measured value of the Vpp voltage (the Vpp measured value) based on the duty ratio. This makes it possible, even in the case where the RF power is changed from the continuous wave to the pulsed wave, to achieve stable monitoring of the ICP plasma by employing the correlation table (such as FIGS. 6 and 10) used before the change.

Consequently, the processing using the ICP plasma to which the pulsed RF power is supplied can be subjected to the substrate W. In addition, in the substrate processing in which the pulsed RF power is supplied, if the duty ratio is lowered, the plasma is more likely to be extinguished. However, such a plasma disappearance can also be monitored with high accuracy by employing the monitoring method according to the present embodiment.

Thus, such stable monitoring of the ICP plasma makes it possible to reduce the damage caused by the ICP plasma to the housing 90 mainly made of a dielectric material such as quartz, decreasing the number of particles. In addition, it is possible to reduce or prevent damage to the wafer W itself (charging damage) due to the plasma.

As described above, the monitoring method and the plasma processing apparatus according to the present embodiment make it possible to achieve stable control of the plasma process using the pulsed wave of the RF power.

In one example, the embodiment described herein is not limited to how to obtain the converted value of the Vpp voltage from the measured value of the Vpp voltage using Formula (1) above. For example, in the case where the on-time of the pulsed RF power is fixed and the off-time is variable, the converted value of the Vpp voltage can be obtained from the measured value of the Vpp voltage using Formula (2) as follows:

$$Vpp \text{ converted value} = Vpp \text{ measured value} \times (1 + OFF \text{ time} \times Koff1) \times Koff2 \quad (2)$$

In Formula (2) above, Koff1 and Koff2 are constants and are predetermined values with the ON time fixed.

Further, for example, when the on-time of the pulsed RF power is variable and the off-time is fixed, the converted value of the Vpp voltage may be obtained from the measured value of the Vpp voltage using Formula (3) as follows:

$$Vpp \text{ converted value} = Vpp \text{ measured value} \times (1 + Kon1 / ON \text{ time}) \times Kon2 \quad (3)$$

In Formula (3) above, Kon1 and Kon2 are constants and predetermined values with the OFF time fixed.

The plasma processing apparatus disclosed herein is applicable, but not limited to the specific plasma processing apparatus illustrated in FIG. 1, to an inductively coupled plasma (ICP) apparatus.

According to one aspect, it is possible to provide a monitoring method and a plasma processing apparatus enabling stable control of a plasma process using the pulsed wave of RF power.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A monitoring method comprising:
 (a) providing a plasma processing apparatus including:
  a processing chamber;
  a stage disposed in the processing chamber and configured to place a substrate thereon;
  an antenna provided on an upper part of the processing chamber;
  an RF power supply connected to the antenna and configured to supply RF power;
  a matching box arranged between the antenna and the RF power supply; and
  a gauge configured to measure a voltage of an output terminal of the matching box;
 (b) placing the substrate on the stage;
 (c) supplying a pulsed wave of the RF power with a predetermined duty ratio from the RF power supply; and
 (d) converting a Vpp voltage of the output terminal voltage based on the duty ratio, and monitoring a plasma stste based on the converted Vpp voltage, the RF power, and correlation information indicating a correlation between the Vpp voltage and the RF power,
 wherein, in (d), the converted value of the Vpp voltage is calculated using Formula (1) below:

$$Vpp \text{ converted value} = Vpp \text{ measured value} \frac{1}{duty \text{ ratio}} \times K \quad (1)$$

where Vpp converted value is a value obtained by converting the Vpp voltage, Vpp measured value is a value obtained by measuring the Vpp voltage, and K is a constant.

2. The monitoring method according to claim 1, wherein, in (d), the plasma state is monitored using a result obtained by determining whether the converted value of the Vpp voltage falls within a range of an upper limit value of the Vpp voltage to a lower limit value of the Vpp voltage based on the correlation information.

3. The monitoring method according to claim 2, wherein, in (d), when determined that the converted value of the Vpp voltage falls within the range of the upper limit value of the Vpp voltage to the lower limit value of the Vpp voltage, an ICP plasma is determined to be generated.

4. The monitoring method according to claim 2, wherein, in (d), when determined that the converted value of the Vpp voltage exceeds the upper limit value of the Vpp voltage or falls below the lower limit value of the Vpp voltage, a CCP plasma is determined to be generated or no plasma is determined to be generated.

5. The monitoring method according to claim 1, further comprising:

(e) stop supplying the pulsed wave of the RF power from the RF power supply and supplying a continuous wave of the RF power from the RF power supply; and (f) monitoring the plasma state based on the Vpp voltage of the output terminal, the RF power, and the correlation information after executing (e).

6. A plasma processing apparatus comprising:

a processing chamber;

a stage disposed in the processing chamber and configured to place a substrate thereon;

an antenna provided on an upper part of the processing chamber;

an RF power supply connected to the antenna and configured to supply RF power;

a matching box arranged between the antenna and the RF power supply;

a gauge configured to measure an output terminal voltage of the matching unit; and a control device, wherein the control device performs control of (a) placing the substrate on the stage;

(b) supplying a pulsed wave of the RF power with a predetermined duty ratio from the RF power supply; and (c) converting a Vpp voltage of the output terminal voltage based on the duty ratio, and monitoring a plasma state based on the converted Vpp voltage, the RF power, and correlation information indicating a correlation between the Vpp voltage and the RF power, wherein, in (c), the converted value of the Vpp voltage is calculated using Formula (1) below:

$$Vpp \text{ converted value} = Vpp \text{ measured value } \frac{1}{\text{duty ratio}} \times K \qquad (1)$$

where Vpp converted value is a value obtained by converting the Vpp voltage, Vpp measured value is a value obtained by measuring the Vpp voltage, and K is a constant.

7. A monitoring method comprising:

(a) providing a plasma processing apparatus including:

a processing chamber;

a stage disposed in the processing chamber and configured to place a substrate thereon;

an antenna provided on an upper part of the processing chamber;

an RF power supply connected to the antenna and configured to supply RF power;

a matching box arranged between the antenna and the RF power supply; and a gauge configured to measure a voltage of an output terminal of the matching box;

(b) placing the substrate on the stage;

(c) supplying either a continuous wave or a pulsed wave of the RF power with a predetermined duty ratio from the RF power supply; and (d) when the pulsed wave of the RF power is supplied, converting a Vpp voltage of the output terminal voltage based on the duty ratio, and monitoring a plasma state based on the converted Vpp voltage, the RF power, and correlation information indicating a correlation between the Vpp voltage and the RF power, and when the continuous wave of the RF power is supplied, monitoring the plasma state based on the Vpp voltage of the output terminal, the RF power, and the correlation information.

*     *     *     *     *